United States Patent [19]

Frye et al.

[11] 4,047,215
[45] Sept. 6, 1977

[54] UNIPHASE CHARGE COUPLED DEVICES

[75] Inventors: Robert Charles Frye, Plano; Horng-Sen Fu, Dallas; Al F. Tasch, Jr., Richardson, all of Tex.

[73] Assignee: Texas Instruments Incorporated, Dallas, Tex.

[21] Appl. No.: 545,954

[22] Filed: Jan. 31, 1975

[51] Int. Cl.² .................. H01L 29/78; H01L 29/04; G11C 19/28
[52] U.S. Cl. ....................... 357/24; 357/59; 307/221 D; 357/91
[58] Field of Search .......... 357/24; 307/221 C, 221 D

[56] References Cited

U.S. PATENT DOCUMENTS

| | | | |
|---|---|---|---|
| 3,697,786 | 10/1972 | Smith | 357/24 |
| 3,789,267 | 1/1974 | Krambeck et al. | 357/24 |
| 3,796,932 | 3/1974 | Amelio et al. | 357/24 |
| 3,796,933 | 3/1974 | Arnett et al. | 357/24 |
| 3,911,560 | 10/1975 | Amelio et al. | 357/24 |
| 3,918,997 | 11/1975 | Mohsen et al. | 357/24 |

OTHER PUBLICATIONS

W. Kosonocky "Two-Phase Charge-Coupled Devices" RCA Technical Note No. 931 (4/73) 2 pages.

*Primary Examiner*—William D. Larkins
*Assistant Examiner*—Gene M. Munson
*Attorney, Agent, or Firm*—Harold Levine; James T. Comfort; Rene E. Grossman

[57] ABSTRACT

A continuous gate electrode overlies the channel of the CCD and is connected to a uniphase clock pulse source for operation of the CCD. Pairs of gate conductor-insulator-semiconductor regions are defined along the channel. In each pair of regions the surface potential-gate voltage characteristic of one region intersects that of the other region, such that in the OFF condition of a clock pulse the potential well at one region of each pair is deeper than that of the other region; in the ON condition of a clock pulse, this situation is reversed. In this manner, charge packets are propagated along the channel and unidirectionality is achieved by locally implanted potential wells or potential barriers in each of the aforesaid regions. The shift in surface potential gate voltage of one of the regions in each pair of regions, to produce the required intersection, is achieved by an implanted charge accumulation layer at the insulator-semiconductor interface at those regions which, in one embodiment, are defined at locally thickened areas of the insulating layer, so that the threshold voltage is greater than an intermediate regions at which the insulator layer is thinner. In a preferred embodiment, using a uniform thickness insulating layer, the threshold voltage difference is achieved by use of local, heavily doped semiconductor regions spaced along the channel with charge accumulation layers formed at the interface between those regions and the insulating layer. Fabrication techniques employing ion implantation are described for both embodiments.

9 Claims, 8 Drawing Figures

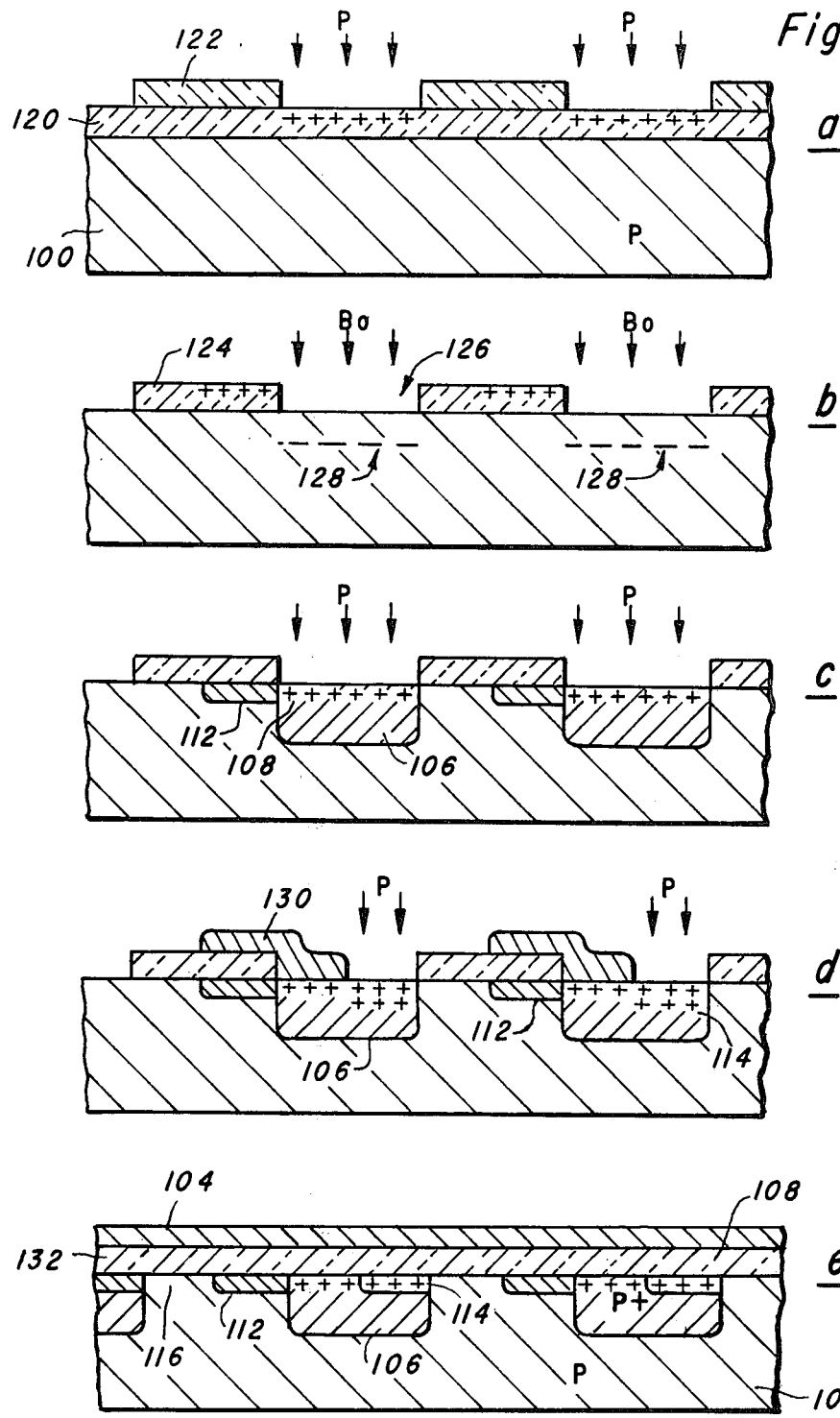

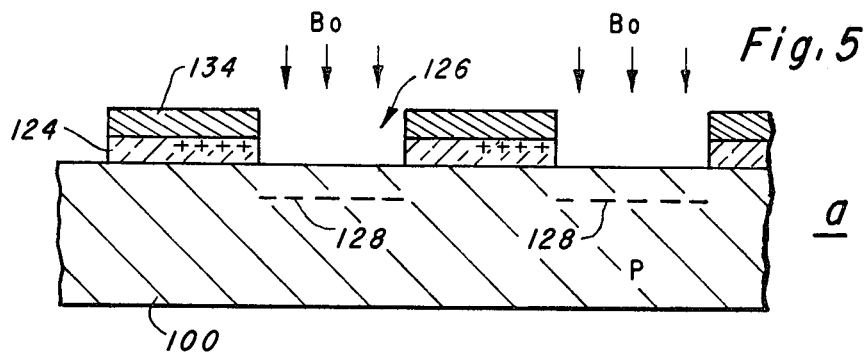
Fig. 5
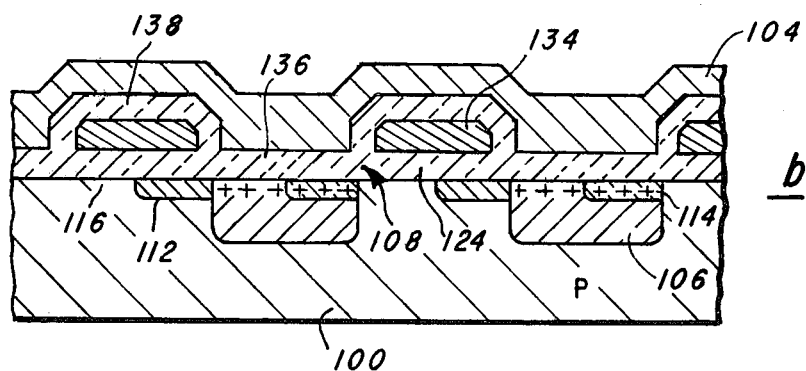
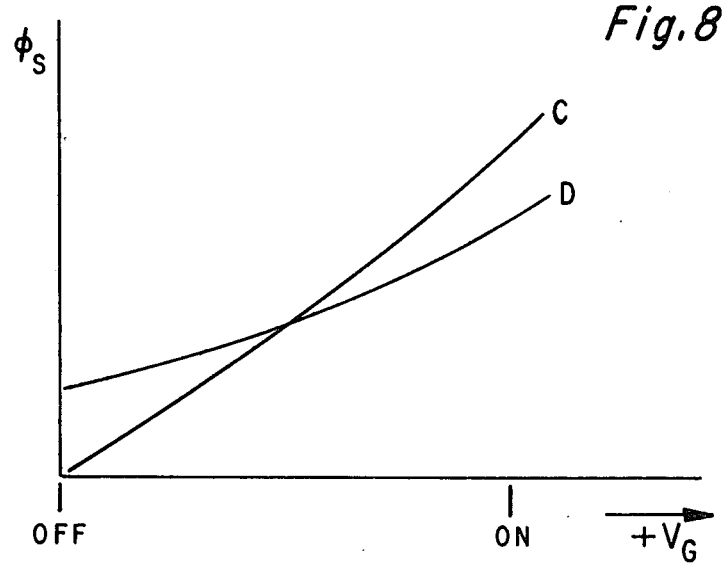
Fig. 8

Fig. 6
| 22 | 20 | 17 ‖ 18 | (Fig. 1)
| 116 | 112 | 118 ‖ 114 | (Fig. 3)
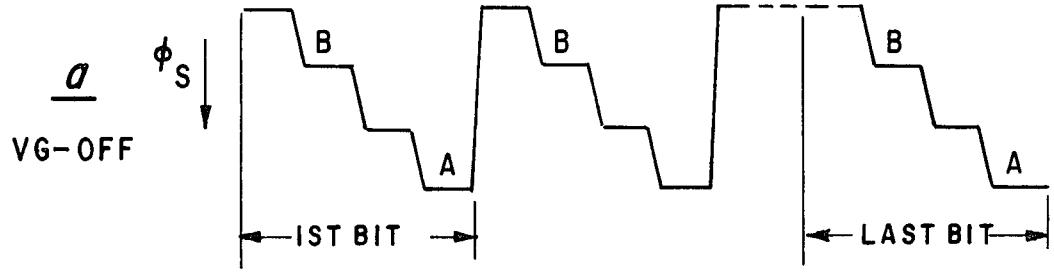
a  VG-OFF
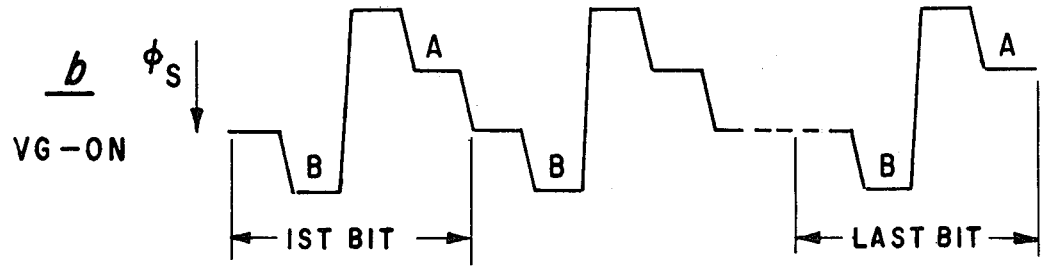
b  VG-ON
Fig. 7

UNIPHASE CHARGE COUPLED DEVICES

This invention relates to charge transfer devices and in particular to uniphase charge coupled devices (CCD).

There have previously been reported proposals for CCDs using only a single clock signal. P. P. Gelberger and C. A. T. Salama, *Proceedings of the I.E.E.E.*, June, 1972, pp. 721 and 722 "A Uniphase Charge Coupled Device," suggest a structure making use of charge storage in an MNOS (metal nitride oxide silicon) structure to define in the silicon substrate the asymmetric potential wells required for unidirectional charge flow. The structure includes a silicon substrate with overlying layers of silicon dioxide and silicon nitride and spaced apart individual charge transfer electrodes on the nitride layer. Required potential wells are defined by forming an appropriate pattern of charge accumulation at the oxide-nitride interface. R. D. Melen and James D. Meindl, I.E.E.E., *Journal of Solid State Circuits*, February, 1972, pp. 92–93 propose a two-phase CCD structure employing a two-level offset aluminum-polysilicon gate structure with the aluminum and polysilicon gates connected together in pairs. Alternate gate pairs are connected to respective clock lines, one of which is held at a d.c. bias while clock pulses are applied to the other clock line. Both of these proposals have inherent fabrication and/or functional disadvantages.

It is an object of the present invention to provide a uniphase CCD structure having a relatively simple structure and manner of operation.

According to the present invention, a uniphase charge coupled device structure utilizes a continuous conductive gate layer over the channel of the CCD, with alternating conductive layer-insulating layer-semiconductor regions of different threshold voltages along the channel. For a first predetermined gate voltage level, the threshold voltage at one region of each pair is greater than that at the other region of each pair while for a second predetermined gate voltage level, this situation is reversed. Thus, by application of single phase clock pulses to the conductive gate layer, charge packets may be propagated along the channel between potential wells at each of the aforesaid regions. Such a structure is advantageous not only in that uniphase clocking is employed, but also in that patterning of individual gate or charge transfer electrodes is not required, and problems due to intra- and inter-level short circuits therefore do not arise. In one particular embodiment of the invention, the required threshold voltage characteristic for each pair of regions is obtained by use of an insulating layer having alternating thick and thin regions and a charge accumulation layer at each thick insulating layer region semiconductor surface interface to shift the threshold voltage characteristic of that region so that the semiconductor surface potential-gate voltage at that region intersects the semiconductor surface potential-gate voltage characteristic at the thin insulating layer region of that pair.

In an alternative and preferred embodiment, the CCD channel utilizes a uniform thickness insulating layer with doped regions of the same conductivity type but higher conductivity than the substrate spaced apart along the channel, threshold voltage shifting charge accumulation layers being defined at the interface between the doped regions and the insulating layer, so that the semiconductor surface potential-gate voltage characteristic at the doped regions intersects the semiconductor surface potential-gate voltage characteristic at the regions intermediate the doped regions.

In order that the invention may be more readily understood and put into effect, embodiments thereof will be described in greater detail with reference to the drawings, wherein FIG. 1 is a section along the channel of a CCD structure according to a first embodiment of the invention;

FIG. 4 shows a portion of the structure of FIG. 3 at various stages during fabrication thereof;

FIG. 5 illustrates modification of the process steps described with relation to FIG. 4;

FIG. 6 is a diagrammatic representation of potential wells associated with operation of the CCD structures shown in FIGS. 1 and 3;

FIG. 7 shows pulse timing wave forms explanatory of operation of the CCD structures shown in FIGS. 1 and 3;

Figure 1:
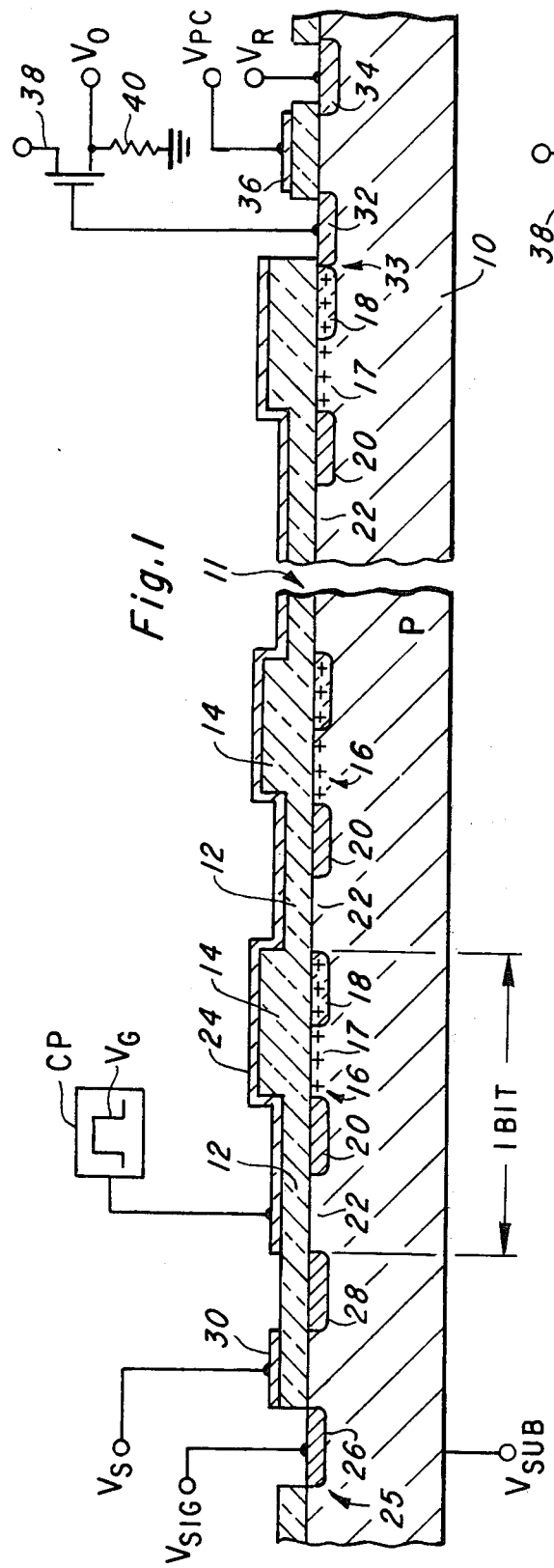
Figure 3:
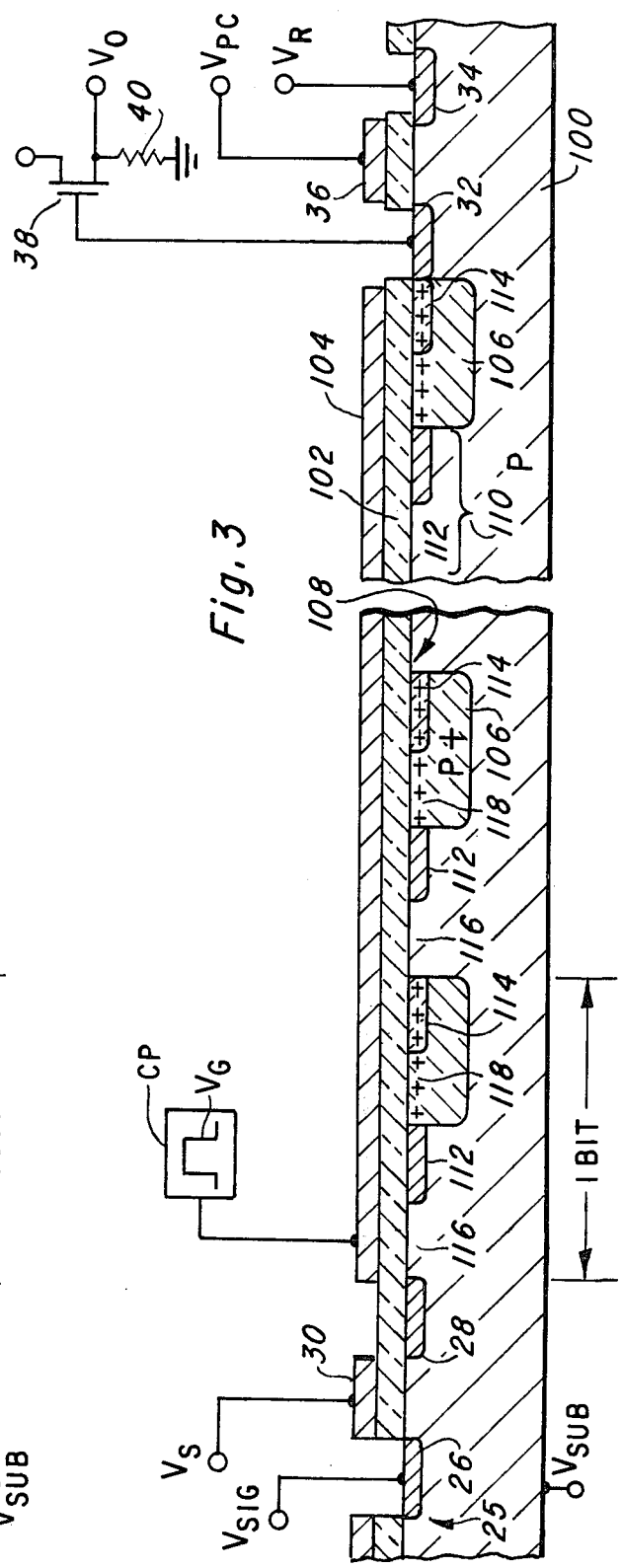
FIG. 3 is a section along another CCD structure embodying the invention.

FIG. 8 is a plot of surface potential-gate voltage characteristics relating to the structures of FIGS. 1 and 3; and FIG. 1 is a diagrammatic section along the channel of a uniphase CCD structure embodying the present invention. The drawing is not to scale. The CCD structure includes a channel formed in a p-type silicon substrate 10 having a doping density suitably greater than $2 \times 10^{15}$ cm$^{-3}$ and preferably greater than $5 \times 10^{15}$ cm$^{-3}$. The upper surface of the substrate 10, as seen in FIG. 1, is covered by an insulating layer 11 which, along the channel of the CCD, includes thin and thick strip regions 12 and 14 respectively alternating in the direction of, and extending transversely to, the direction of intended signal propagation along the channel. At the interface between each thick insulating strip 14 and the underlying semiconductor material, a shallow n-type layer 16 extends the whole width and a layer 18 extends about half the width of the strip 14, so that the region 18 is more heavily doped than the region 17. At the interface between each thin insulating strip 12 and the underlying semiconductor material, there is shallow n-type surface region 20, doped to the same level as region 16, extending about half the width of the strip 12 and located adjacent the next thick insulating layer strip 14 in the direction of signal propagation. Beneath the other half of the width of each insulating strip 12, there is a surface region of the p-type substrate 10. The insulating layer 11 is covered by a continuous, preferably homogeneous conductive layer 24 to which gate voltage, in the form of clock pulses VG, can be applied from a uniphase clock pulse source CP for operation of the CCD structure in shift register fashion to propagate charge packets from the input (lefthand end) to the output (righthand end) of the structure as seen in FIG. 1.

The localized n-type regions 18 and 20 in the p-type substrate 10 define charge accumulation layers resulting in deeper potential wells (more positive semiconductor surface potentials) at those regions. This provides an asymmetric potential well structure imparting a unidirectional characteristic to the CCD structure whereby charge packets can be propagated only from the input towards the output end of the structure as will be explained in more detail below.

FIG. 6 is a diagrammatic illustration of the surface potential variation along the CCD channel for different gate voltage levels VG applied between the conductive layer 11 and the substrate 10, corresponding to ON and OFF conditions of the gate voltage VG (see FIG. 7) supplied by the clock pulse source CP. The substrate is connected to a suitable d.c. bias potential, e.g., −3 volts.

The n-type layers 16 beneath the thick oxide strips 14, provide charge accumulation layers (layers of immobile charge) that adjust the threshold voltage at each thick insulating region, so that the underlying semiconductor channel is normally on for a gate voltage VG = 0, the surface potential level at the region 18 being greater (more positive) than that at the region 17 and thereby preventing backward charge transfer. The potential distribution is illustrated by FIG. 6a. Thus, with VG = 0, a charge packet of minority charge carriers (electrons) can be stored in the potential well A, shown in FIG. 6a. Device operation is based on the principle that the channel surface potential is modulated to a greater extent at the thin insulating layer regions 12 than at the thick insulating layer regions 14. Thus, as the gate voltage VG is increased positively, the surface potential at the regions 17 and 18 beneath the thick insulating layer strips 14 changes very little, while the surface potential at the regions 20 and 22 beneath the thin insulating layer strips 12 increases significantly. With sufficient increase in the gate voltage to the ON condition (see FIG. 6) — e.g. VG = 20 volts, the surface potentials in the regions 20 and 22 at the thin insulating layer strips 12 exceed those at the regions 16 and 18, resulting in a surface potential distribution along the channel as illustrated by FIG. 6b. The surface potential variations at the thin oxide-semiconductor and thick oxide-semiconductor interfaces are illustrated by curves C and D in FIG. 8, (ignoring the effects of the n-type regions 18 and 20), the effect of the n-type layer 16 being to shift the characteristic D to the position shown in FIG. 3, so that it intersects the characteristic C to provide the required gate voltage (VG) surface potential ($\phi$s) characteristic. Thus, during transition of VG from the OFF to the On condition, a charge packet stored in the potential well A (FIG. 6a) will be transferred to the potential well B (FIG. 6b). Thus, application of a succession of clock pulses VG to the conductive layer 11 propagates charge packets along the channel of the charge transfer device from the input towards the output end.

It is to be noted in particular, that the conductive layer 24 is a continuous layer and that the necessary changes in surface potential distribution required for charge packet propagation along the channel are effected by utilization of the alternate thin-thick insulating layer regions in conjunction with the n-type charge accumulation layers 16 beneath the insulating layer 11 to provide proper adjustment of the threshold voltage beneath the thick insulating layer strips 14, and the localized n-type layers 18 and 20 providing the asymmetry in the surface potential distribution required for unidirectional charge propagation.

The CCD, as shown in FIG. 1, also has input and output structures associated therewith. The input structure includes an input diode 25 defined by an n+ region 26 and the adjacent substrate region, with an ohmic contact to the region 26 for receiving a signal voltage Vsig. Spaced from the region 26 is a floating n+ region 28 which overlaps the portion of the gate conductor 24 over the thin insulating strip 12 of the first bit of the CCD structure. A conductive electrode 30 on the insulating layer 11 extends between and overlaps the regions 26 and 28 for receiving sampling pulses VS. During each OFF period of the clock pulses VG, a sampling pulse VS is applied to the electrode 30, charging the floating region 28 to a level determined by the amplitude of the signal voltage applied to the input diode 25 (alternatively, the signal voltage could be applied to the electrode 30 and the sample pulses VS applied to the input diode 25). During the ON periods of the clock pulses VG, charge can transfer as a minority carrier charge packet from the floating region 28 into the potential well B (see FIG. 6b) under the thin insulating strip 12 of the first bit of the CCD.

This charge packet (and charge packets subsequently inputted into the first bit) are then propagated toward the output end of the channel by application of a train of clock pulses VG to the conductive layer 24. The output structure includes a pair of spaced apart n+ regions 32 and 34, the region 32 being overlapped by the thick insulating strip 14 of the final bit of the CCD, and together with the adjacent substrate region forming an output diode 33. An electrode 36 on the insulating layer 11 extends between and overlaps the regions 32 and 34. An ohmic connection to the region 34 permits application of a reference voltage thereto while an ohmic connection to the region 32 is connected to the gate of an insulated gate field effect transistor (IGFET) 38, connected in source follower configuration with a load resistor 40 to provide output signals VO from the CCD. During an ON condition of the clock pulse VG, a precharge pulse VPC is applied to the electrode 36 to precharge the region 32 to the reference voltage VR. During the next OFF period of the clock pulse VG, a charge packet in the potential well A beneath the thick insulating strip 14 of the final bit of the CCD is transferred to the output diode region 32, thereby switching ON the IGFET 38 to provide an output voltage VO across the load resistor 40.

A suitable timing diagram for VG, VS and VPC is shown in FIG. 7, and it is to be noted that no clocking operations occur at a frequency higher than the output data rate. Advantageously, clock drive circuitry can be provided on the substrate 10, suitably using IGFET devices.

Figure 2:
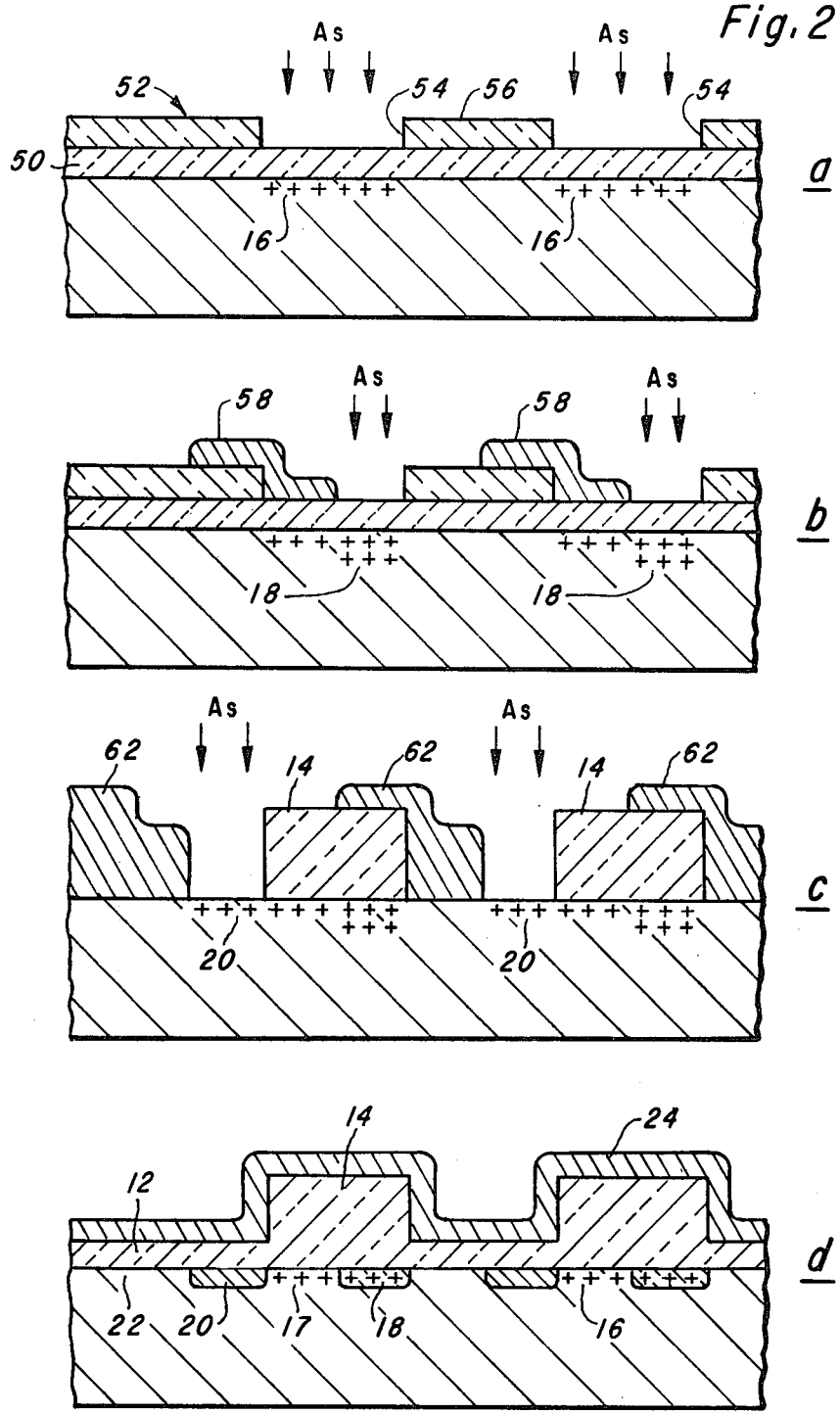
FIG. 2 shows a portion of the channel of the CCD shown in FIG. 1 during various stages of fabrication thereof.

By way of example, a process suitable for fabricating a CCD as shown in FIG. 1 will be described with reference to FIG. 2. As shown in FIG. 2a, a p-type silicon substrate 10 is used having characteristics as described with reference to FIG. 1. The n+ regions 26, 28, 32, and 34 (not shown in FIG. 5) have previously been formed in the substrate 10 in conventional manner, e.g. diffusion, concurrently with formation of source and drain regions for any IGFET devices (such as the devices 38, 42, 44 and 46) to be formed on the same substrate. The substrate 10 includes a surface layer 50 of silicon oxide, suitably about 1000A thick, and an overlying layer 52 of silicon nitride, suitably about 1500A thick. The fabrication steps and process parameters required to form the structure as thus far described are conventional and further description thereof is not required.

As shown in FIG. 2a apertures 54 are then formed to extend through the nitride layer 52 to expose surface areas of the substrate 10 (over which the thick insulator strips 14 will later be provided) and to define islands 56 of silicon nitride. N-type dopant ions are then implanted into the exposed areas of the substrate to form the layers 16, using a dosage of about 5 to 6 × $10^{11}$ ions/cm². Photoresist implantation mask areas 58, suitably about 4000 A thick, are then defined to cover the lefthand half of each aperture 54 and the adjacent portion of each island 58 as shown in FIG. 2b. The structure then is subjected to a further n-type implantation to define the layer 18, using a dosage of about 2 × 4 × $10^{11}$ ions/cm². The photoresist mask areas 58 are then removed, the silicon oxide in the apertures 54 stripped, and the resultant structure exposed to a thermal oxidizing environment to grow the relatively thick (e.g. 4000A) silicon oxide strips 14 over the exposed surface areas of the substrate 10. The silicon nitride islands 56 and the regions of silicon oxide underlying those islands are then stripped to expose surface areas of the substrate between the thick oxide strips 14. Further photoresist implantation mask areas 62 — again about 4000A thick — are then defined to cover the left-hand half of each exposed substrate surface area and a portion of the adjacent thick oxide strip 14, as shown in FIG. 2c. N-type dopant ions are then implanted through the exposed portions of the islands 58 into the substrate 10, to form the layers 20 using the same dosage as for layers 18, i.e. 2 to 4 × $10^{11}$ ions/cm². The photoresist mask areas 62 are then removed, and relatively thin silicon oxide layers (e.g. 1000A) grown over the exposed surface areas of the substrate to form the thin insulating layer strips 12 shown in FIG. 1. A layer of metal, suitably aluminum, is then deposited and patterned to define the single continuous gate electrode 24, which would be rectangular, extending over the thin and thick oxide layer portions 12 and 14 as shown in FIG. 2d. The electrodes 30 and 36 as well as the ohmic contacts to the regions 26, 32, and 34 are formed at the same time as the metal layer 24. The conductive layer 24, as well as the other electrodes and ohmic contacts referred to, may alternatively be defined from a deposited polysilicon layer.

Each bit of the CCD structure described above comprises substrate regions underlying a thin insulating layer strip 12 and the adjacent thick insulating strip 14, and the width of each strip can readily be defined to have a length of about 0.3 mil thereby rendering a bit length of 0.6 mil feasible. The charge carrying capacity is determined by the n-type implantation dosage described with reference to FIG. 2b and 2c, so that in the specific example described with reference to FIG. 2, the maximum signal capacity is 2 to 4 × $10^{11}$ electrons/cm².

Instead of implanting n-type ions as described with reference to FIGS. 2b and 2c, the effect of which is to deepen the potential wells in those regions (see FIG. 6), p-type dopant ions (e.g. boron) could instead be implanted at the sites of regions 18 and 20. The effect of this p-type dopant implantation would be to create local potential barriers, and the charge carrying capacity (and hence the maximum signal capacity) would then be determined by the dosage of the barrier implant which also might typically be about 2 to 4 × $10^{11}$ ions/cm².

Another, and preferred embodiment of the invention, is illustrated by FIG. 3 and employs a semiconductor substrate 100 having a uniform thickness insulating layer 102 overlying the channel of the CCD structure. The substrate 100 comprises p-type silicon, and the insulating layer 102 comprises silicon oxide having a continuous metal gate layer 104 thereon which extends the length of the channel and is connected to a clock pulse source CP. Along the length of the channel are spaced apart p+ pockets 106, each having an n-type surface charge accumulation layer 108 at the interface with the overlying oxide layer 102. The silicon oxide-semiconductor surface potential characteristic at the substrate surface regions 110 (and corresponding metal-oxide-semiconductor threshold voltage characteristic) is shown by curve C in FIG. 8. The effect of the layer 108 is to shift the silicon oxide-semiconductor interface characteristic (and corresponding metal-oxide-semiconductor threshold voltage characteristic) in the areas of the pockets 106 as illustrated by the curve D in FIG. 8, so that the curve D intersects the curve C. Localized n-type surface layers 112 and 114 are formed over the righthand portions of the regions 110 and 106, respectively, to form localized potential wells for asymmetric surface potential distribution to achieve unidirectional charge packet propagation along the channel.

Each bit of the CCD thus includes a p-substrate region 110 and a doped p+ pocket 106 as indicated in FIG. 3. Along the length of each bit, at the semiconductor-oxide interface, there is a substrate region 116, an n-type surface layer 112, a region 118 of the p+ pocket 106, and an n-type surface layer 114. The resultant surface potential variations for OFF and ON conditions of the gate clock pulses VG are shown in FIG. 6.

The CCD structure of FIG. 3 also includes input and output structures as previously described with reference to FIG. 1 and identified by like references in FIG. 3; the clock pulse timing diagram for operation of the structure of FIG. 3 is shown in FIG. 7. Charge packets entered into floating region 28 by pulse VS during an OFF period of the clock pulse VG and transferred from the input structure during an ON period of the clock pulses VG, into the most positive potential well of the first bit of the CCD channel, i.e. the potential well B underlying the region 112 of that bit. Repetitive application of clock pulses VG propagates charge packets along the CCD channel towards the output end thereof. Charge packets are extracted from the potential well A at the region 114 of the p+ pocket 106 of the final bit during an OFF period of the gate pulse VG, the diode 33 having been precharged during the preceding clock pulse (VG) ON period by a pulse VPC. Thus, it will be appreciated that operation of the input and output structures in FIG. 3 is the same as previously described with reference to FIG. 1.

Also, as in the case of the FIG. 1 structure, the output stage 38, 40 as well as clock drivers as shown in FIG. 9 may readily be fabricated as integrated circuit elements on the substrate 100.

A suitable process for fabrication of the CCD structure shown in FIG. 3 will be described with reference to FIG. 4. A p-type silicon substrate, preferably of 10-20 ohm-cm or greater resistivity is used. As in the case of fabrication of the structure shown in FIG. 1, doped regions for the input and output structures and any other circuit elements would previously have been formed in the substrate. As shown in FIG. 4a, the substrate has a silicon oxide layer 120 about 1000A thick thereon. Patterned photoresist implantation mask areas 122 (about 4000A) are then formed over the oxide layer 120, and n-type dopant ions are implanted into the oxide layer. The photoresist areas 122 are then stripped and the oxide layer 120 selectively etched to define oxide islands 124, the righthand half of which are doped with n-type ions while the lefthand half portions are undoped, as shown in FIG. 4b. P-type dopant ions then are implanted into the exposed surface areas 126 of the substrate to form subsurface implanted p-doped layers 28 between the oxide islands 124 as shown in FIG. 4b.

The structure is then subjected to a high temperature, e.g. in the range 900° to 1100° C, to drive n-type ions from the oxide islands 124 into the substrate 100 to form n-type surface layers 112 and to distribute the p-type dopant layers 128 to define the p+ doped pockets 106 as shown in FIG. 4c. The n-type dopant ions implanted into the oxide layer 120 thus are used to provide local diffusion sources in the oxide islands 124, and the implant dosage is selected, in relation to the drive in temperature and ion beam energy, to result in a dosage of about $0.5$ to $1.5 \times 10^{12}/cm^2$ in the n-type layers 112. The p-type implant dosage is selected to provide a dopant concentration of about $10^{16}$ to $10^{17}$ atoms/cm$^3$ in the p+ pockets 106. After the high temperature drive in step, a second n-type dopant implantation is affected with a dosage of about $10^{12}$ ions/cm$^2$ to define the surface charge accumulation layers 108 in the p+ pockets 106 which serve to shift the threshold voltage at those regions to intersect that at the intervening substrate regions 110 as illustrated by the curves D and C respectively in FIG. 8.

Photoresist implantation mask areas 130, again suitably about 4000A thick, are then defined over the left-hand half of each p+ pocket 106 and the adjacent portions of the oxide islands 124. N-type dopant ions are then implanted into the exposed surface areas of the p+ pockets 106 to define the surface layers 114 with a dosage equal to that of the surface layers 112, i.e. about 0.5 to $1.5 \times 10^{12}/cm^2$.

The mask areas 130 and oxide islands 124 are then stripped and a uniform thickness silicon oxide layer 132, about 1000A thick, thermally grown over the substrate surface. A metal layer is then deposited over the oxide layer 132 and patterned to define the continuous gate layer 104 over the CCD channel, as well as the electrodes 30, 36 (not shown in FIG. 4) and ohmic contacts and interconnections for other circuit elements as required.

A modification of the process described with reference to FIG. 4 may be followed to provide double level interconnections between circuit elements of other circuits formed on the semiconductor substrate 100, while maintaining a single gate electrode CCD structure. After the steps described with reference to FIG. 4a have been carried out, the oxide layer 120 is masked with patterned polysilicon areas 134 to define the silicon oxide islands 124, as shown in FIG. 5a, and the processing steps described with reference to FIGS. 4b to 4d are then carried out. At this stage, the polysilicon/silicon oxide islands 134, 124 are left in place and the thermal oxidation step performed to cover the substrate surface areas 106 with a silicon oxide layer 136 about 1000A thick and also to provide a silicon oxide coating 138 over the surfaces of the polysilicon islands 134. After metal deposition and patterning to define the conductive layer 104, a structure as shown in FIG. 9b results. The conductive layer 104 is shorted to the polysilicon islands 134 for proper operation of the uniphase CCD structure.

The structure shown in FIG. 3 (whether fabricated according to the process of FIG. 4 or FIG. 5) is advantageous compared to that described with reference to FIG. 1, in that significantly increased signal size handling capabilities are possible.

In the processes described with reference to FIGS. 2, 4 and 5, phosphorus or arsenic may suitably be used as the n-type dopant ion source and boron as the p-type dopant ion source. An implantation beam energy of about 100 kev is suitable, although this is not critical. Both processes are advantageous in that the implantation steps are self-aligning so that high packing density and relaxed photolithography definition requirements can be realized. Furthermore, there are very few steps requiring definition of small geometry areas.

In fabrication of existing CCD structures, a major yield-loss mechanism is due to inter-level and intra-level short circuits between adjacent or overlapping gate electrodes. It will therefore be appreciated that a major advantage of a CCD structure embodying the present invention, is the use of a continuous conductive layer extending along the complete length of the channel of the CCD and common to all the bits of the CCD structure. Consequently, both intra-level and inter-level short circuit problems are completely avoided.

Instead of using a p-type silicon substrate, an n-type silicon substrate could be used to fabricate a CCD embodying the invention, with appropriate changes in dopants and operating voltage polarities. Also, semiconductor materials other than silicon could be used for the substrate, and insulating layers other than silicon oxide, e.g. silicon nitride, could be used for the insulating layer. The specific embodiments described are exemplary, and the invention includes all embodiments within the scope of the claims.

What is claimed is:

1. A uniphase charge coupled device structure comprising a semiconductor substrate of one conductivity type including therein a channel for said device, an insulating layer on said substrate having a uniform thickness over said channel, a continuous planar conductive layer covering said channel for receiving charge transfer clock pulses, said planar conductive layer being separated from said channel only by said insulating layer, said substrate further including input structure for inputting charge packets to one end of said channel and output structure for extracting charge packets from the opposite end of said channel, and wherein along the length of said channel first substrate regions are separated by second substrate regions comprising packets of semiconductor material of said one conductivity type and having higher impurity concentration than said substrate, each of the first and second regions including a transfer and storage portion at the interface of the insulating layer and the regions, the transfer portion of a region located between the input structure and the storage portion of a region, a layer of immobile charge comprised of dopant impurities of opposite conductivity type from that of said substrate included in the storage portion of each first region but not in the transfer portion of any first region, and included in the storage and transfer portions of said second regions, said layer of immobile charge having a higher impurity concentration in the storage portion of each second region that the transfer portion of a second regions.

2. A charge coupled device according to claim 1, wherein said substrate is a p-type substrate, said semiconductor pockets comprise p+ semiconductor material and said layer of immobile charge comprises n-type implanted ions.

3. A charge coupled device according to claim 2, wherein said semiconductor substrate is silicon, and wherein said conductive layer includes a continuous metal layer on said insulating layer.

4. A charge coupled device according to claim 1, wherein said continuous conductive layer is a homogeneous layer.

5. A charge coupled device according to claim 1, wherein said continuous conductive layer is a metal layer.

6. A charge coupled device according to claim 1, wherein said semiconductor substrate comprises a silicon substrate, said insulating layer is a silicon oxide layer, and said conductive layer is a metal layer.

7. A uniphase charge coupled device structure comprising a semiconductor substrate of one conductivity type including therein a channel for said device, a first insulating layer on said substrate having a uniform thickness over said channel, a plurality of polycrystalline semiconductor electrodes on said insulating layer spanning and spaced apart along the length of said channel and each of said polycrystalline semiconductor electrodes including a surface insulating layer thereon, a metal conductive layer continuously spanning and overlying said channel along the length thereof for receiving single phase clock pulses, said metal layer separated from said channel by said uniform thickness insulating layer in regions between said semiconductor electrodes, means electrically connecting said polycrystalline semiconductor electrodes in common with said metal conductive layer, said substrate further including input structure for inputting charge packets to one end of said channel and output structure for extracting charge packets from the opposite end of said channel, and wherein along the length of said channel first substrate regions under said electrodes are separated by second substrate regions under said electrode spacing comprising pockets of semiconductor material of said one conductivity type and having higher impurity concentration than said substrate, each of the first and second regions including a transfer and storage portion at the interface of the insulating layer and the regions, the transfer portion of a region located between the input structure and the storage portion of a region, a layer of immobile charge comprised of dopant impurities of opposite conductivity type from that of said substrate included in the storage portion of each first region but not in the transfer portion of any first region, and included in the storage and transfer portions of said second region, said layer of immobile charge having a higher impurity concentration in the storage portion of each second region than the transfer portion of a second region.

8. A charge coupled device according to claim 7 wherein said semiconductor substrate and said polycrystalline semiconductor electrodes comprise silicon and said insulating layer comprises silicon oxide.

9. A charge coupled device according to claim 7, wherein said substrate is a p-type substrate, said semiconductor pockets comprise p+ semiconductor material and said layer of immobile charge comprises n-type implanted ions.

* * * * *